(12) United States Patent
Dadvand et al.

(10) Patent No.: US 11,121,076 B2
(45) Date of Patent: Sep. 14, 2021

(54) SEMICONDUCTOR DIE WITH CONVERSION COATING

(71) Applicant: TEXAS INSTRUMENTS INCORPORATED, Dallas, TX (US)

(72) Inventors: Nazila Dadvand, Richardson, TX (US); Christopher Daniel Manack, Flower Mound, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 13 days.

(21) Appl. No.: 16/454,847

(22) Filed: Jun. 27, 2019

(65) Prior Publication Data

US 2020/0411429 A1  Dec. 31, 2020

(51) Int. Cl.
| | | |
|---|---|---|
| H01L 23/522 | (2006.01) | |
| H01L 23/31 | (2006.01) | |
| H01L 23/528 | (2006.01) | |
| H01L 23/532 | (2006.01) | |
| H01L 21/768 | (2006.01) | |
| H01L 23/00 | (2006.01) | |

(52) U.S. Cl.
CPC .... *H01L 23/5226* (2013.01); *H01L 21/76802* (2013.01); *H01L 21/76841* (2013.01); *H01L 21/76877* (2013.01); *H01L 23/3107* (2013.01); *H01L 23/5283* (2013.01); *H01L 23/53238* (2013.01); *H01L 24/05* (2013.01); *H01L 2224/05118* (2013.01)

(58) Field of Classification Search
CPC ........... H01L 23/5226; H01L 21/76802; H01L 21/76841; H01L 21/76877; H01L 23/3107; H01L 23/5283; H01L 23/53238
See application file for complete search history.

(56) References Cited

U.S. PATENT DOCUMENTS

| | | |
|---|---|---|
| 5,637,916 A | 6/1997 | Joshi |
| 6,093,476 A | 7/2000 | Horiuchi et al. |
| 6,664,864 B2 | 12/2003 | Jiles et al. |
| 6,706,553 B2 | 3/2004 | Towle et al. |
| 7,078,788 B2 | 7/2006 | Vu et al. |
| 7,345,361 B2 | 3/2008 | Mallik et al. |
| 7,466,210 B2 | 12/2008 | Knecht et al. |
| 7,545,047 B2 | 6/2009 | Bauer et al. |

(Continued)

OTHER PUBLICATIONS

Texas Instruments, Design Summary for MicroSiP™-enabled TPS8267xSiP, Q1 2011, Dallas, Texas.

(Continued)

*Primary Examiner* — Sheng-Bai Zhu
(74) *Attorney, Agent, or Firm* — Dawn Jos; Charles A. Brill; Frank D. Cimino (57) ABSTRACT

A die includes a semiconductor layer, an electrical contact on a first side of the semiconductor layer, a backside electrical contact layer on second side of the semiconductor layer. The die further includes a zinc layer over at least one of the electrical contact or the backside electrical contact layer of the die, and a conversion coating over the zinc layer. The conversion coating includes at least one of zirconium and vanadium. As part of an embedded die package including the die, at least a portion of the conversion coating may adjacent to an electrically insulating substrate of the embedded die package.

20 Claims, 10 Drawing Sheets

(56) References Cited

U.S. PATENT DOCUMENTS

| | | | |
|---|---|---|---|
| 7,646,610 | B2 | 1/2010 | Watanabe |
| 7,815,751 | B2 | 10/2010 | Pemberton et al. |
| 7,838,337 | B2 | 11/2010 | Marimuthu et al. |
| 8,138,609 | B2 | 3/2012 | Horiuchi et al. |
| 8,203,203 | B1 | 6/2012 | Scanlan |
| 8,810,024 | B2 | 8/2014 | Lin et al. |
| 9,647,329 | B2 | 5/2017 | Herbsommer et al. |
| 9,663,357 | B2 | 5/2017 | Nguyen et al. |
| 9,679,863 | B2 | 6/2017 | Lin et al. |
| 9,799,620 | B2 | 10/2017 | Huang et al. |
| 9,837,303 | B2 | 12/2017 | Lin et al. |
| 2004/0156999 | A1* | 8/2004 | Biddulph ................ C23C 22/53 427/436 |
| 2010/0078655 | A1* | 4/2010 | Yang ................ H01L 23/49816 257/81 |
| 2013/0249101 | A1 | 9/2013 | Lin et al. |
| 2014/0360986 | A1* | 12/2014 | Sigler ................ B23K 11/115 219/91.2 |
| 2015/0061103 | A1 | 3/2015 | Manack et al. |
| 2015/0069600 | A1 | 3/2015 | Zhang |
| 2016/0020121 | A1* | 1/2016 | Mohammed ............ H01L 24/24 29/842 |
| 2016/0240392 | A1 | 8/2016 | Poddar |
| 2019/0013288 | A1 | 1/2019 | Kim et al. |
| 2019/0019776 | A1 | 1/2019 | Tuncer et al. |

OTHER PUBLICATIONS

Austria Technologie & Systemtechnik, Embedded Device Packaging Ramping Up Next Generation SiP, May 2011, Nürnberg, Germany.

Stahr et al., Embedded Components on the Way to Industrialisation, Oct. 2011, Austria Technologie & Systemtechnik, Leoben, Austria.

Stahr et al., Simulation of Embedded Components in PCB Environment and Verification of Board Reliability, 2013, Austria Technologie & Systemtechnik, Leoben, Austria.

Austria Technologie & Systemtechnik, Considerations for Embedding Passives and Actives in PCBs, Oct. 2014, Boston, Massachusetts.

Tschandl, Embedding Passive and Active Devices in Substrates, Jul. 23, 2015, Austria Technologie & Systemtechnik, Santa Clara Valley, California.

* cited by examiner

SEMICONDUCTOR DIE WITH CONVERSION COATING

TECHNICAL FIELD

This disclosure relates to semiconductor packages.

BACKGROUND

An embedded die package includes die, such as an integrated circuit (IC) die, embedded in a substrate with a construction similar to the polymer structure of a printed circuit board (PCB). Passive components may be connected to the die. Such passive components may be positioned on the top of the substrate or may be embedded in the substrate. Circuit layers within the substrate are connected to filled or plated through-holes extending through the substrate. Embedded die packages may be mounted on external circuitry, such as PCBs, with solder joints electrically connecting the circuit layers within the substrate to the external circuitry. For example, some embedded die packages be produced in a ball grid array (BGA) format.

BRIEF SUMMARY

Dies disclosed herein include a conversion coating over a conductive element of the die, such as an electrical contact or the backside electrical contact layer of the die. Within an embedded die package, the conversion coating is between the conductive element of the embedded die and an electrically insulating substrate, such as a laminate substrate. The conversion coating promotes adhesion between the conductive element of an embedded die and the electrically insulating substrate. Such designs may reduce the prevalence of adhesion failure and resulting delamination compared to alternate designs not including a conversion coating. In some examples, the conversion coating may include at least one of zirconium and vanadium. In the same or different examples, the conductive element of an embedded die may be a copper element with an outer zinc layer, the zinc layer both protecting the copper element from oxidation and being receptive to the conversion coating.

In one example, an embedded die package includes an electrically insulating substrate forming a first surface and a second surface, the first surface generally opposing the second surface, a first circuit layer supported by the electrically insulating substrate, a second circuit layer supported by the electrically insulating substrate, and a die embedded in the electrically insulating substrate between the first circuit layer and the second circuit layer. The die includes a semiconductor layer, an electrical contact on a first side of the semiconductor layer, and a backside electrical contact layer on second side of the semiconductor layer. The embedded die package further includes a zinc layer over at least one of the electrical contact or the backside electrical contact layer of the die, and a conversion coating over the zinc layer. The conversion coating includes at least one of zirconium and vanadium, and at least a portion of the conversion coating is adjacent to the electrically insulating substrate.

In another example, a semiconductor die includes a semiconductor layer, an electrical contact on a first side of the semiconductor layer, a backside electrical contact layer on second side of the semiconductor layer, a zinc layer over at least one of the electrical contact or the backside electrical contact layer of the die, and a conversion coating over the zinc layer. The conversion coating includes at least one of zirconium and vanadium.

In another example, a method of forming an embedded die package includes applying a conversion coating including at least one of zirconium and vanadium over at least one of an electrical contact or a backside electrical contact layer of a die. The die includes a semiconductor layer, the electrical contact on a first side of the semiconductor layer, the backside electrical contact layer on second side of the semiconductor layer, and a zinc layer over at least one of the electrical contact or the backside electrical contact layer of the die. The method further includes mounting the backside electrical contact layer to a second metal substrate with a die attach, applying laminate layers to the second metal substrate, covering the die, applying a first metal substrate over the laminate layers, and curing the laminate layers to form an electrically insulating substrate with the die embedded in the electrically insulating substrate between the first metal substrate and the second metal substrate. At least a portion of the conversion coating is adjacent to the electrically insulating substrate.

DETAILED DESCRIPTION

Figure 1A:
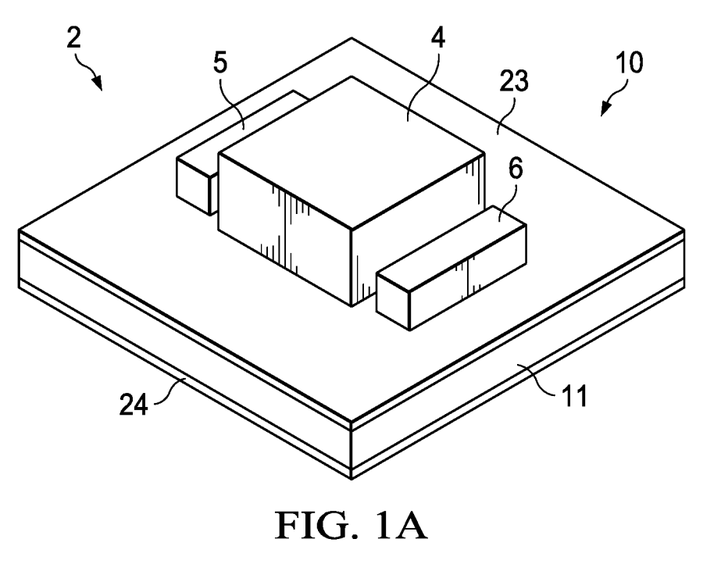
FIGS. 1A and 1B are perspective and exploded views of an assembly including an embedded die package with passive components mounted thereon.
Figure 1B:
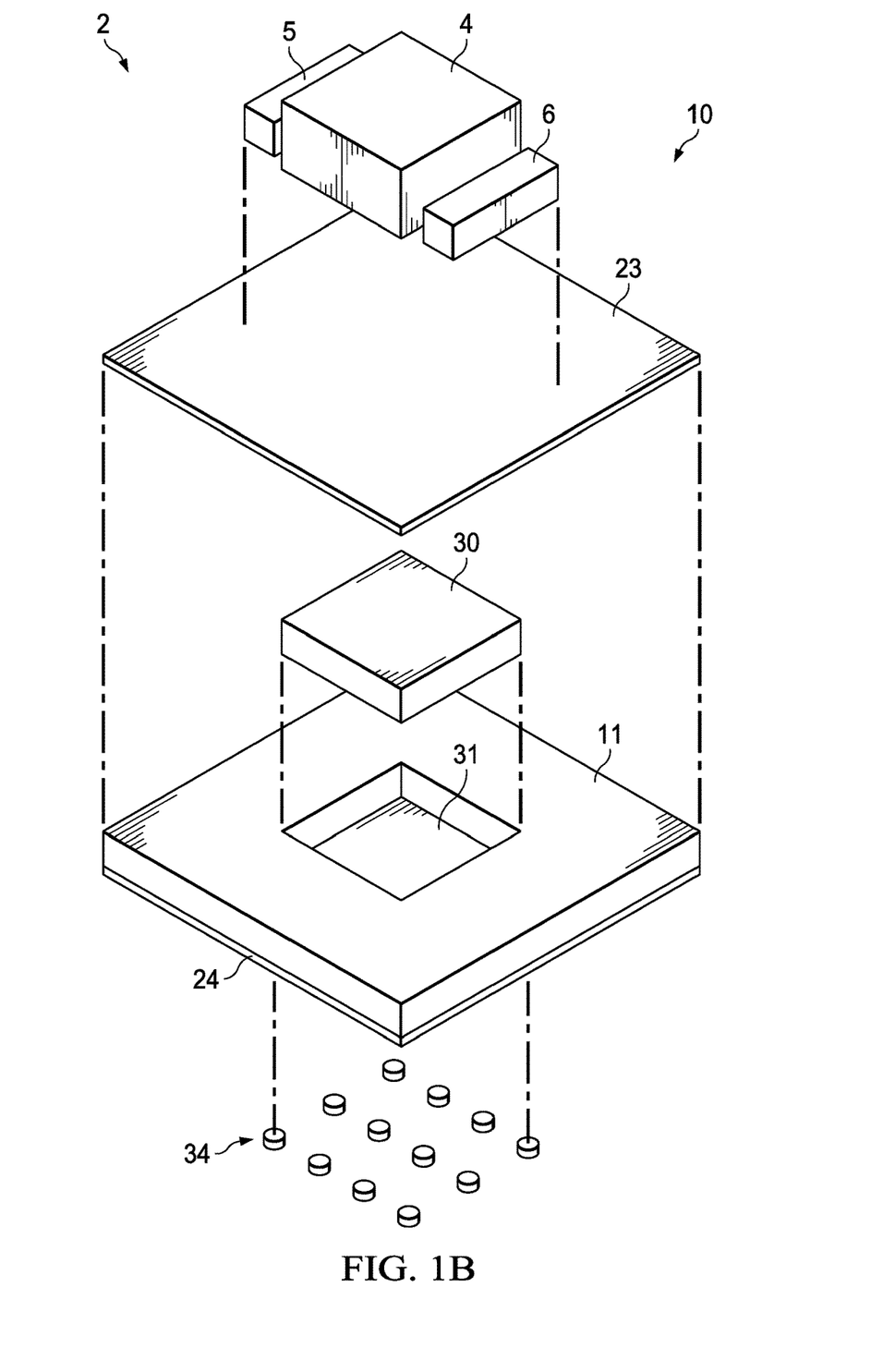
Figure 2A:
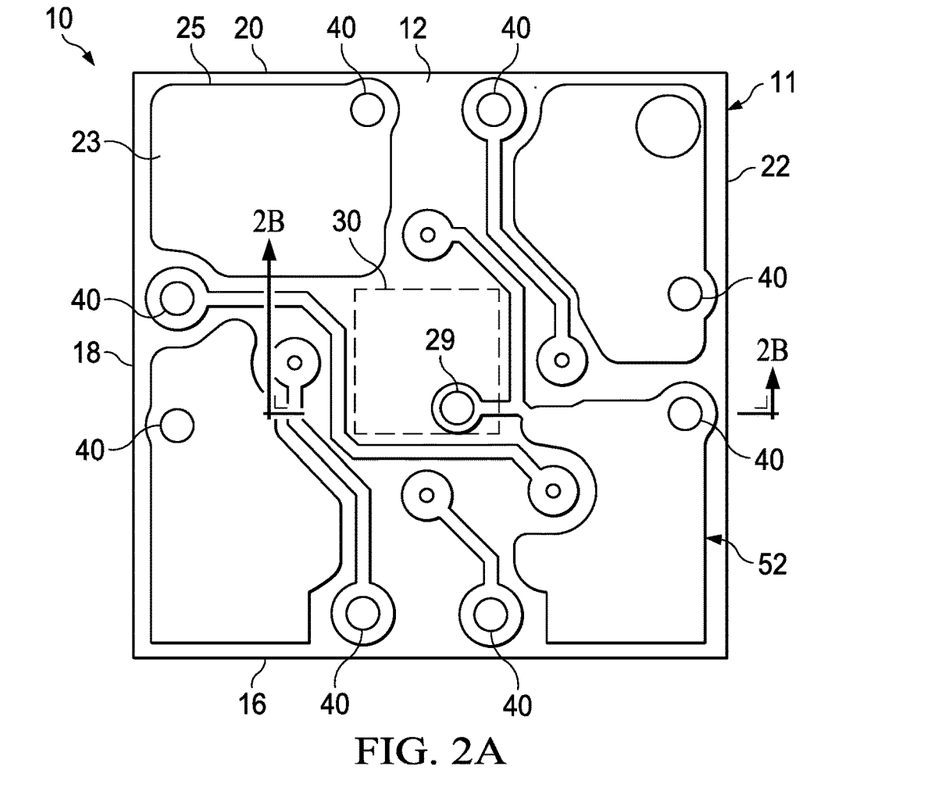
FIGS. 2A and 2B are top and schematic cross-sectional perspective views of the embedded die package of the assembly of FIGS. 1A and 1B.
Figure 2B:
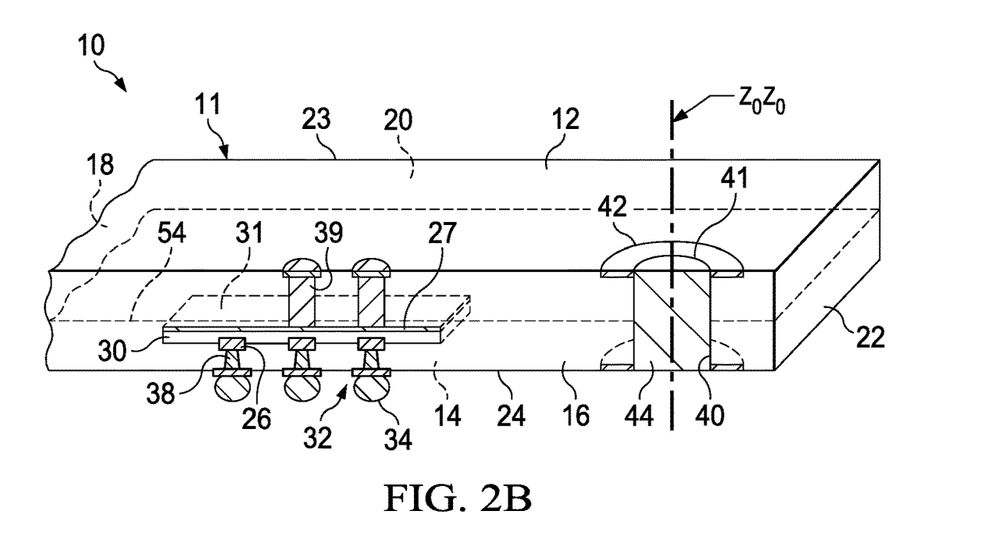

FIG. 1A is a perspective view of an assembly 2 including an embedded die package 10 with passive components 4, 5, 6 mounted thereon. FIG. 1B is an exploded view of assembly 2. FIG. 2A is a top view of embedded die package 10, including an electrically insulating substrate 11 and a die 30. FIG. 2B is a schematic cross-sectional perspective view of embedded die package 10. In accordance with the techniques disclosed herein, embedded die package 10 includes a conversion coating between a conductive element of embedded die 30, such as an electrical contact 26 or a backside electrical contact layer 27, and substrate 11. The conversion coating promotes adhesion between the conductive element of die 30 and substrate 11.

In the example shown in the figures, electrically insulating substrate 11 is a rectangular box shaped, although the particular shape of substrate 11 is not germane to this disclosure. Substrate 11 has a first surface 12, a second surface 14 generally opposing first surface 12, and a plurality of lateral side faces 16, 18, 20, and 22 extending between surfaces 12, 14. As used herein, a surface is the surface of one of the largest sides of a component.

Electrically insulating substrate 11 may comprise materials commonly used to form electrically insulating substrates in PCBs. For example, substrate 11 may be a polymeric substrate. In the same or different examples, substrate 11 may be an epoxy substrate, such as a composite including glass fiber and a polymeric epoxy. Such composites may be laminate composites, as described with respect to FIGS. 6A-6F.

Die 30 is embedded in substrate 11 within a cavity 31 between circuit layer 23 and circuit layer 24. In examples in which access to the die 30 from the external environment is not a requirement, cavity 31 may be encased within substrate 11. In other examples, die 30 requires access to the external environment, for example, as part of a sensor assembly. In such examples, cavity 31 would then extend from a surface of substrate 11. In the example of assembly 2, die 30 is encased within substrate 11 between circuit layers 23, 24 rather than exposed to the external environment.

Die 30 includes a semiconductor layer 125, such as a silicon layer (FIG. 4A), electrical contacts 26 on a first side of semiconductor layer 125, and a backside electrical contact layer 27 on second side of semiconductor layer 125. For example, backside electrical contact layer 27 may be an electroplated copper layer on the semiconductor layer of die 30.

A conversion coating covers one or more of electrical contacts 26 and/or backside electrical contact layer 27. In one particular example, the conversion coating covers an exposed surface of a backside electrical contact layer of die 30 adjacent to substrate 11. Such designs may reduce the prevalence of adhesion failure between die 30 and substrate 11 compared to alternatives not including a conversion coating. Such adhesion failure may cause delamination between die 30 and substrate 11. In some examples, the conversion coating may include at least one of zirconium and vanadium. In the same or different examples, the conductive element of an embedded die may be a copper element with an outer zinc layer, the zinc layer both protecting the copper element from oxidation and being receptive to the conversion coating.

Package 10 comprises a plurality of laterally extending circuit layers supported by substrate 11, including external circuit layers 23, 24, and an intermediate circuit layer 54, FIG. 2B, which is located between surfaces 12, 14 of substrate 11. The circuit layers provide electrical connections between die 30, passive components 4, 5, 6 and exposed electrical contacts on a surface of package 10, such as electrical contacts of ball grid array 32 (FIG. 2B).

In the specific example shown in the figures, external circuit layer 23 is supported by substrate 11 along surface 12, and external circuit layer 24 is supported by substrate 11 along surface 14. Embedded die package 10 optionally includes solder mask layers over substrate 11 and one or both of external circuit layers 23, 24.

Package 10 may further include one or more intermediate circuit layers, such as intermediate circuit layer 54 (FIG. 2B). In some particular examples, package 10 may two intermediate circuit layers in addition to external circuit layers 23, 24. For example, such intermediate circuit layers may represent ground planes and power planes for embedded die package 10. However, any number of configurations of intermediate and external circuit layers is possible in accordance with the examples of this disclosure.

Package 10 includes vias 38, 39 and through-holes 40, which provide electrical connections between die 30 and intermediate and external circuit layers of package 10. The circuit layers may electrically connect electrical contacts 26 on the die 30 to metal, such as metal plating or filled metal, within the various vias 38, 39 and through-holes 40. One example circuit configuration 25, which could be provided on an external or intermediate circuit layer, is illustrated in FIG. 2A. As shown in FIG. 2B, vias 38, 39 and through-holes 40 may connect to one or more of external circuit layers 23, 24 and intermediate circuit layer 54 via conductive pathways of the circuit layer, such as conductive pathway 42 shown in FIG. 2B. Such conductive pathways are adjacent to the associated via 38, 39 or through-hole 40, and may surround the associated via 38, 39 or through-hole 40.

Vias 38, 39 and through-holes 40 include metal to provide the electrical connections. In various examples, vias 38, 39 and through-holes 40 may be filled with a conductive material, such as with conductive material 44 (FIG. 2B). In addition to, or as an alternative to, filling with a conductive material, vias 38, 39 and through-holes 40 may also plated with a conductive plating layer applied to the side wall along electrically insulating substrate 11, such as conductive plating layer 41.

Specifically, vias 38 extend between surface 14 and electrical contacts 26 of die 30, whereas vias 39 extend between surface 12 and backside electrical contact layer 27 of die 30. Each of vias 38 terminate at a contact of ball grid array 32 such that electrical contacts 26 of die 30 may form connections with external components, such as PCB 60 (FIG. 3A) through ball grid array 32. Each of vias 38 may also connect to one or more of intermediate and external circuit layers of package 10, such as external circuit layer 24. One or more of vias 38 may connect to a contact of ball grid array 32 without also connecting to any of the intermediate and external circuit layers of package 10.

Similar to vias 38, vias 39 provide an electrical connection pathway from surface 12 to backside electrical contact layer 27. Vias 39 may also connect to one or more of intermediate and external circuit layers of package 10, such as external circuit layer 23. Vias 39 may instead connect to an external contact along surface 12 without also connecting to any of the intermediate and external circuit layers of package 10. For example, such an external contact along surface 12 may facilitate a wirebond connection to electrical contact layer 27.

In addition to vias 38, 39, through-holes 40 may provide electrical connections between the intermediate and external circuit layers of package 10, such as external circuit layers 23, 24 and intermediate circuit layer 54. Through-holes 40 extend between surface 12 and surface 14 of the substrate 11. In some examples, through-holes 40 are cylindrical through-holes. For example, through-hole 40 of FIG. 2B, is a cylindrical through-hole with a central axis $Z_0Z_0$ perpendicular to surfaces 12, 14.

Figure 3A:
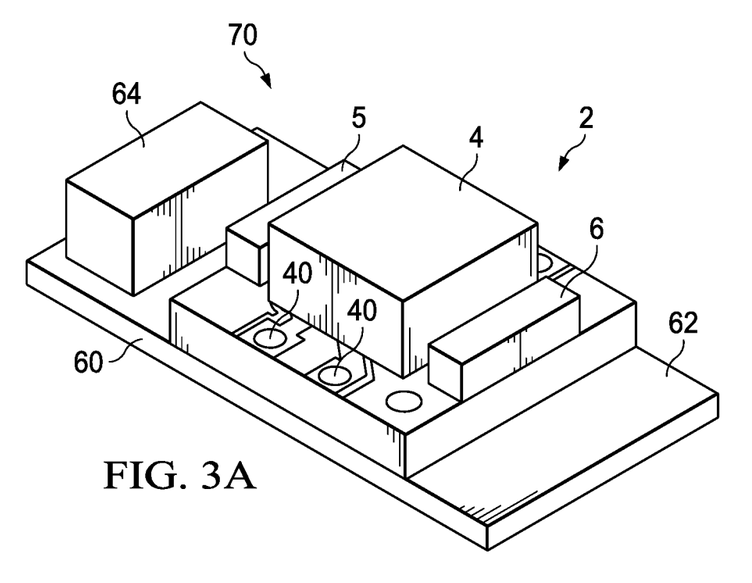
FIGS. 3A and 3B are perspective and exploded views of an assembly including an embedded die package with passive components mounted thereon, mounted on a printed circuit board (PCB).

As shown in FIG. 2B, embedded die package 10 includes electrical contacts for electrically connecting package 10 to an underlying PCB 60 (FIG. 3A). One such means may be a ball grid array 32 having a plurality of solder balls 34. PCB 60 has an array of electrical contact surfaces 66 (FIG. 3B) adapted to be bonded to solder balls 34 of ball grid array 32.

Figure 3B:
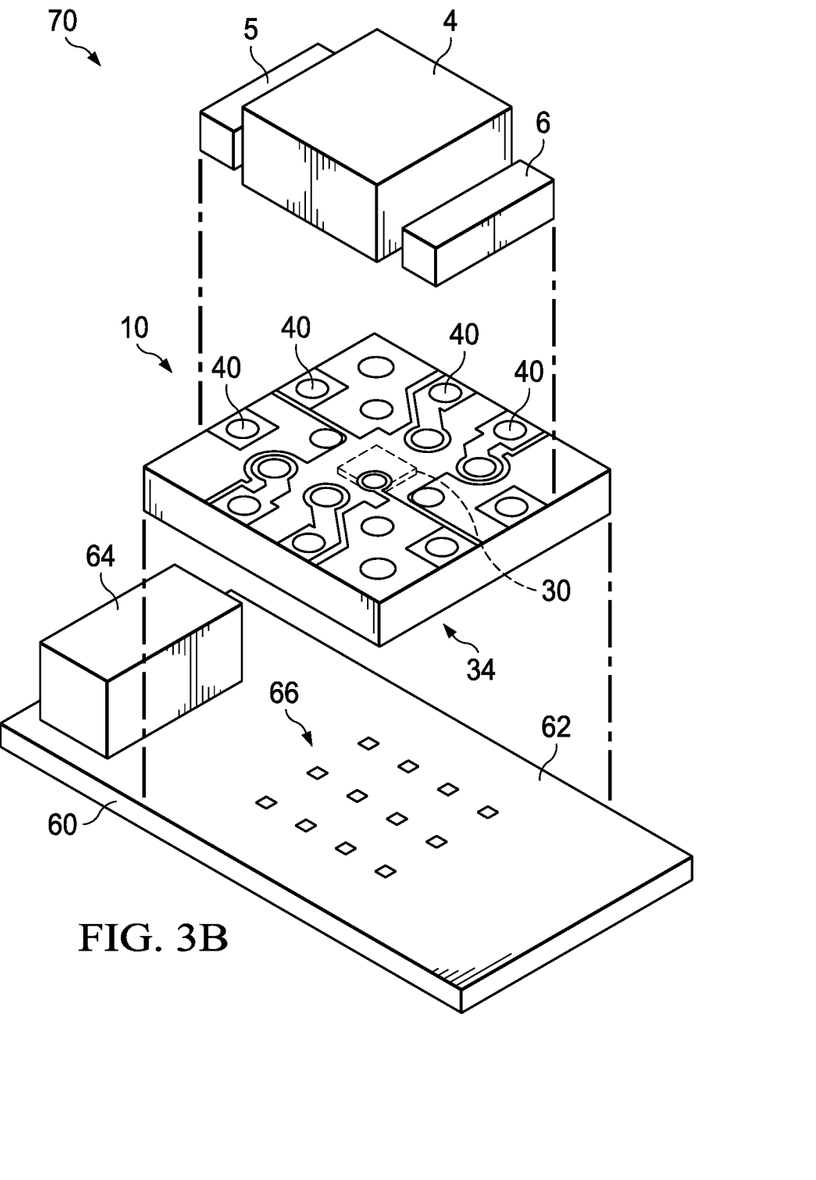

FIG. 3A is a perspective view of an assembly 70. FIG. 3B is an exploded view of assembly 70. Assembly 70 includes assembly 2 (FIG. 1A) with embedded die package 10 and components 4, 5, 6, mounted on a PCB 60. Component 64 is further mounted on PCB 60. In various examples, PCB 60 may be a conventional PCB or wiring board or interposer or other electrical connection board.

Embedded die package 10 is mounted on top face 62 of PCB 60 in that it is both electrically and physically supported by PCB 60 on top face 62. Ball grid array 32 or other bottom contact surfaces of embedded die package 10 are connected to oppositely positioned electrical contact surfaces 66 on top face 62 of PCB 60. Electrical contact surfaces 66 are electrically connected to the exposed conductive material in package 10 (e.g., copper or silver plating or filling). The electrical connection between PCB 60 and package 10 may be provided by solder joints formed from reflow of solder balls 34 or other connection material. In this manner, the solder joints connect electrical contact surfaces 66 on top face 62 of PCB 60 to the metal conductors of vias 38 (FIG. 2B).

Electrical connection joints, such as solder joints may also provide the physical connection between PCB 60 and embedded die package 10. In some examples, additional material, such as a nonconductive die attach or tape may further strengthen the physical connection between PCB 60 and embedded die package 10.

In the specific example of FIG. 3A, component 64 is mounted on top face 62 of PCB 60 in that it is both electrically and physically supported by PCB 60 on top face 62. Additional components may also be mounted on PCB 60, on top face 62 or otherwise. Component 64 may connect to embedded die package 10 through circuit layer(s) of PCB 60. In one particular example, component 64 may represent a power terminal for PCB 60 and embedded die package 10.

In the same or different examples, assembly 2 including embedded die package 10 may represent a DC-DC converter, such as a buck converter. In such examples, die 30 may be an integrated circuit including the DC-DC converter integrated circuit of the DC-DC converter. Passive components 4, 5, 6 may comprise two chip capacitors and an inductor, such as a foil inductor, for the DC-DC converter. The configuration of assembly 2 as a DC-DC converter is merely one example, and conversion coatings as described herein may be used with any other embedded die package configurations.

FIGS. 4A-4E are conceptual illustrations of manufacturing steps for a die including a conversion coating, such as die 30 of embedded die package 10. FIG. 5 is a flowchart illustrating a method of forming a die including a conversion coating. For clarity, the techniques of FIG. 5 are described with respect to die 30 and FIGS. 4A-4E; however, the described techniques may also be utilized in the manufacture of other dies including conversion coatings in accordance with the techniques disclosed herein.

Figure 4A:
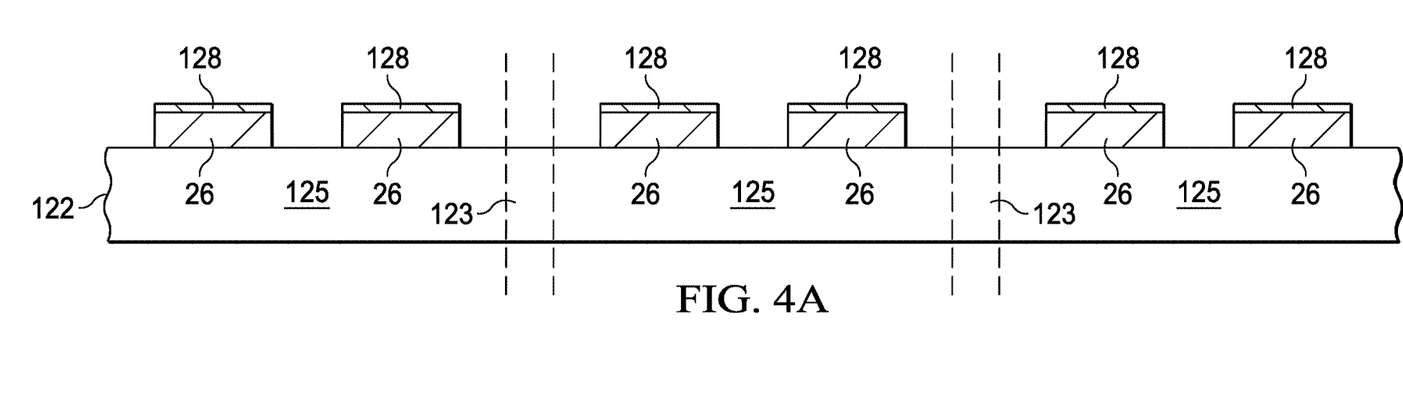
FIGS. 4A-4E are conceptual illustrations of manufacturing steps for a die including a conversion coating, such as the die of the embedded die package of FIGS. 2A and 2B.
Figure 5:
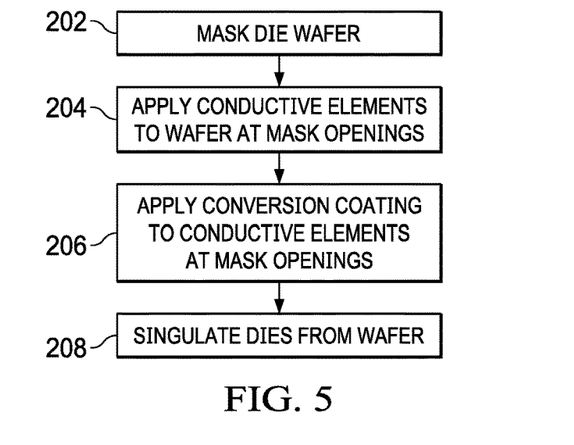
FIG. 5 is a flowchart illustrating a method of forming die including a conversion coating, such as the die of the embedded die package of FIGS. 2A and 2B.

As shown in FIG. 4A, semiconductor wafer 122 forms semiconductor layers 125 for a plurality of dies 30. Cutting zones 123, commonly referred to as streets or scribes, separate the semiconductor layers 125 for each individual die 30. While only three dies 30 are shown in FIG. 4A, a single semiconductor wafer may be contain dozens or even hundreds of dies arranged a planar grid pattern with cutting zones between each of the dies.

In FIG. 4A, electrical contacts 26 for the dies 30 have already been formed on a first side of the semiconductor wafer 122. Electrical contacts 26 include an optional conversion coating 128, which may be applied in a similar manner as described herein with respect to conversion coating 129 on backside electrical contact layer 27.

Figure 4B:
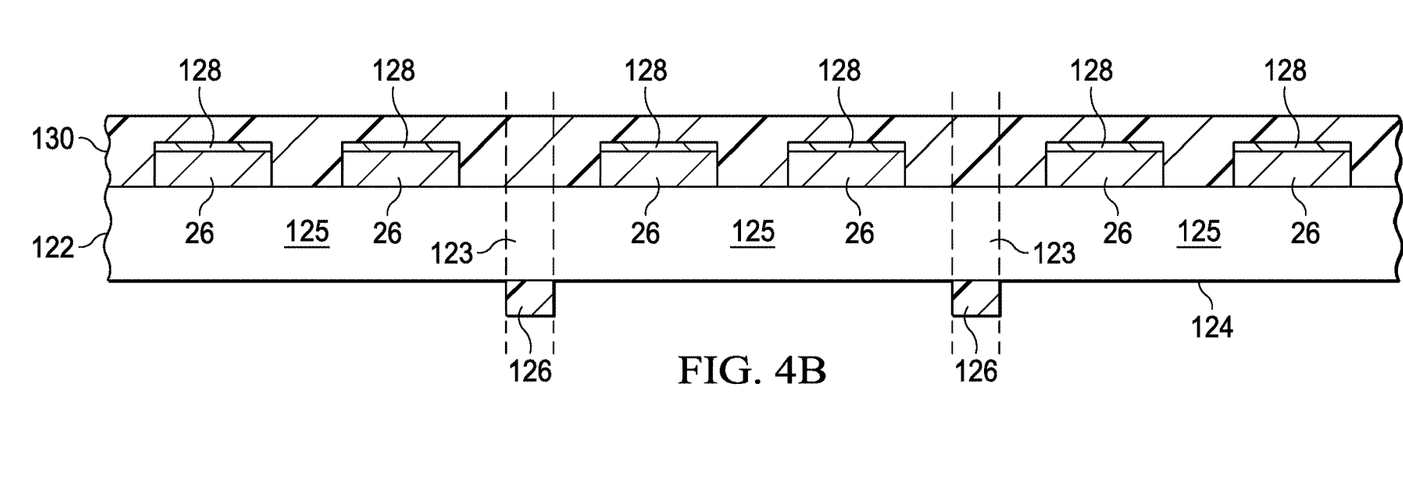

As illustrated in FIG. 4B, semiconductor wafer 122 is thinned by backgrinding on its backside. Temporary protective layer 130 has been applied over electrical contacts 26 to protect electrical contacts 26 during the backgrinding step. Following the backgrinding to thin wafer 122, a diffusion barrier layer (not shown), such as a tungsten-titanium layer, may be applied to wafer backside 124, followed by the application of a seed layer, such as a sputtered copper seed layer (not shown).

Also shown in FIG. 4B, backside 124 of semiconductor wafer 122 is masked to provide openings for a conductive layer (202). For example, masking may include a patterned photo resist layer 126 applied over the backside 124 of semiconductor wafer 122. Generally, the photo resist layer 126 at least covers the cutting zones 123 of semiconductor wafer 122, and may include additional features as desired. Application of the photo resist layer may include first steam coating a photo resist material over a majority or all of backside 124 of semiconductor wafer 122, and developing portions of the photo resist material provide desired openings, such as for backside electrical contact layer 27 of dies 30. The same process may be used for forming electrical contacts 26 on the front side of semiconductor wafer 122, although there will generally be more conductive elements on the front side of semiconductor wafer 122 as compared its backside 124.

Figure 4C:
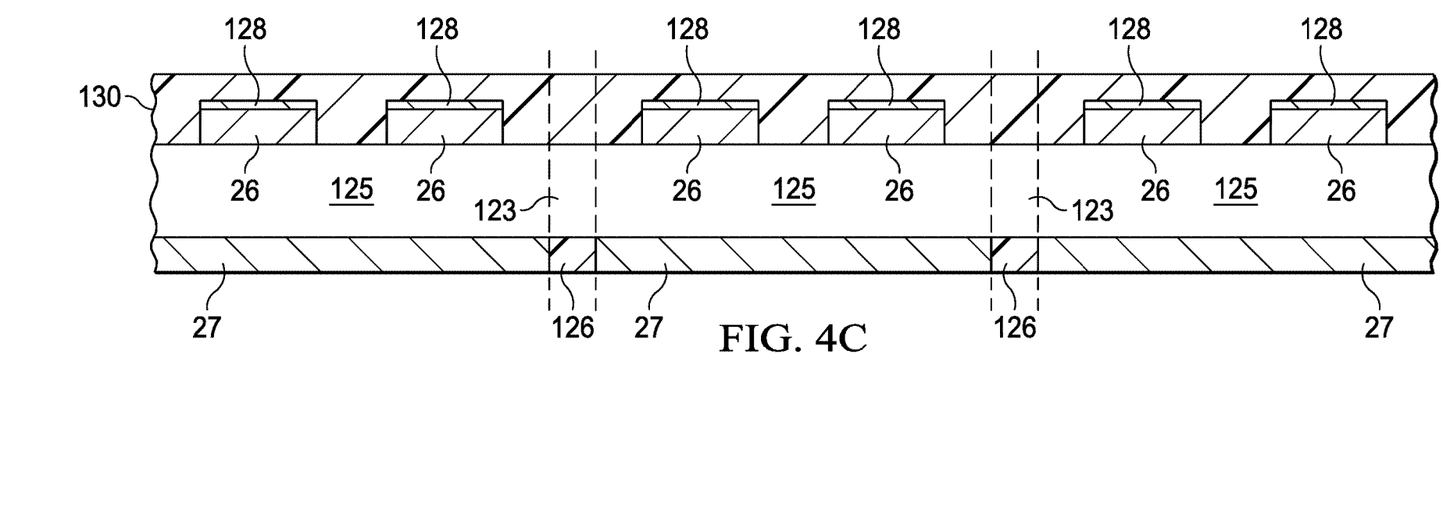

As shown in FIG. 4C, backside electrical contact layer 27 of dies 30 is applied on backside 124 of semiconductor wafer 122 through the openings in patterned photo resist layer 126 (204). For example, backside electrical contact layer 27 may be applied with electroplating, utilizing the seed layer previously applied to wafer backside 124.

Figure 4D:
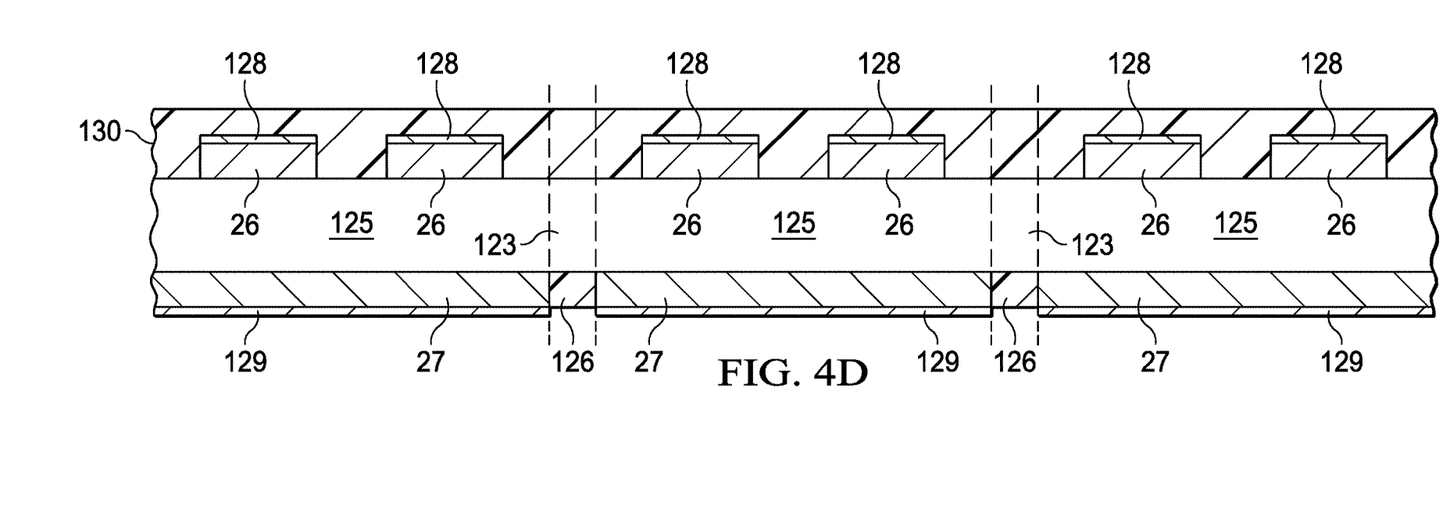
Figure 4E:
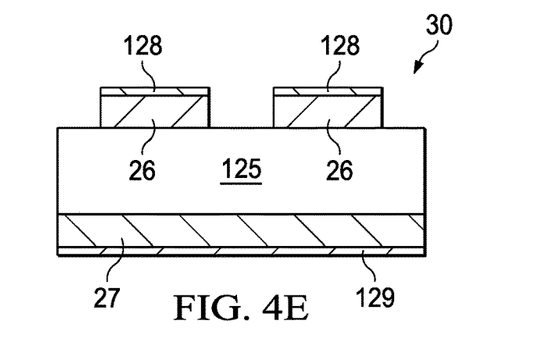

As shown in FIG. 4D, conversion coating 129 is applied to backside electrical contact layer 27 through the openings in the patterned photo resist layer 126 (206). For example, conversion coatings 128, 129 may include zirconium oxide (zirconate) and/or a vanadium oxide (vanadate). In some particular examples, conversion coatings 128, 129 may consist essentially of zirconium oxides and/or vanadium oxides. Any clusters of zirconium and oxygen are contemplated for the zirconium oxides. Likewise, any clusters of vanadium and oxygen are contemplated for the vanadium oxides.

In examples in which electrical contacts 26 and backside electrical contact layer 27 comprise copper or copper alloys, conversion coatings, such as those including zirconium oxides and/or vanadium oxides may not adhere directly to electrical contacts 26 and backside electrical contact layer 27. In such examples, a zinc layer may serve to both protect such copper elements from oxidation and be receptive to conversion coatings 128, 129. Electroless or electroplating techniques may be used to apply zinc to electrical contacts 26 and backside electrical contact layer 27 of die 30. Such applications of zinc generally remove copper oxidation, such that a separate step for removing copper oxidation is not required prior to applying the zinc layer.

Following the application of a zinc layer, applying conversion coatings 128, 129 may include applying a solution including zirconate and/or vanadate to electrical contacts 26 and backside electrical contact layer 27. For example, applying a solution including zirconate and/or vanadate may include immersing backside 124 or all of semiconductor wafer 122 within the solution or spraying the conversion coating solution. As a nonlimiting example, Coral Eco-Treat® NPLF available from Coral Chemical Company of Zion, Ill., USA, may be used as the solution to form the conversion coating, although additional solutions which form zirconate and/or vanadate on zinc surfaces also may be used.

Following the application of conversion coating 129, patterned photo resist layer 126 and protective layer 130 are removed from semiconductor wafer 122. In other examples, patterned photo resist layer 126 may be removed prior to the application of conversion coating 129. In such examples, additional surfaces of backside copper layer may be exposed to receive the conversion coating.

In any event, after the application of conversion coating 129 to dies 30 of semiconductor wafer 122, semiconductor wafer 122 is cut within cutting zones 123, such as by mechanical cutting (e.g., diamond saw) or laser cutting, to singulate the plurality of dies 30 from the wafer (208). The absence of backside electrical contact layer 27 from cutting zones 123 mitigates cutting damage, such as delamination, to backside electrical contact layer 27 due to the singulation process.

In some examples, singulation of semiconductor wafer 122 is performed prior to applying conversion coatings 128, 129 to dies 30. For example, singulation may expose additional copper surfaces that then receive the conversion coatings. However, it may generally be more difficult to apply conversion coatings to singulated dies 30 rather than to a plurality of dies 30 at the same time as part of a common semiconductor wafer.

FIGS. 6A-6F illustrate conceptual process steps for manufacturing embedded die package 10. FIG. 7 is flowchart of a method of forming an embedded die package. For clarity, the techniques of FIG. 7 are described with respect to package 10 and FIGS. 6A-6F; however, the described techniques may also be utilized in the manufacture of other embedded die packages including conversion coatings in accordance with the techniques disclosed herein.

Figure 6A:
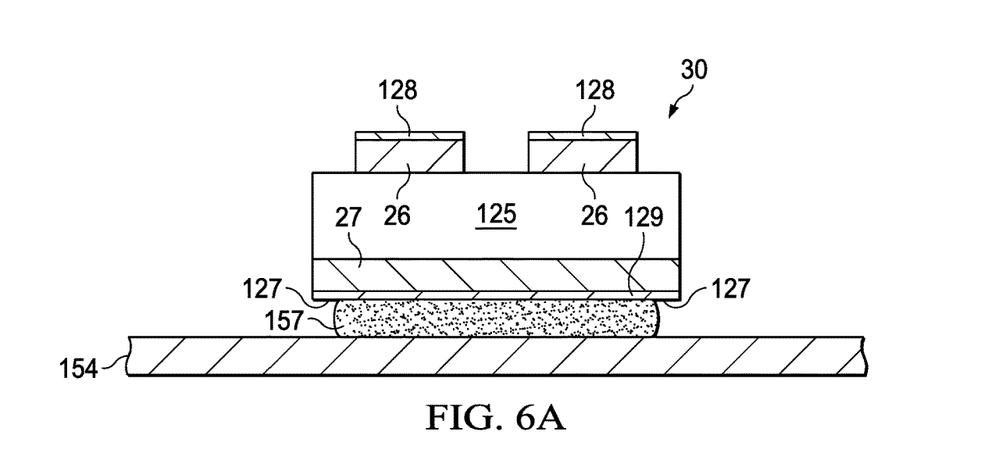
FIGS. 6A-6F are conceptual illustrations of manufacturing steps for an embedded die package, such as the embedded die package of FIGS. 2A and 2B.
Figure 7:
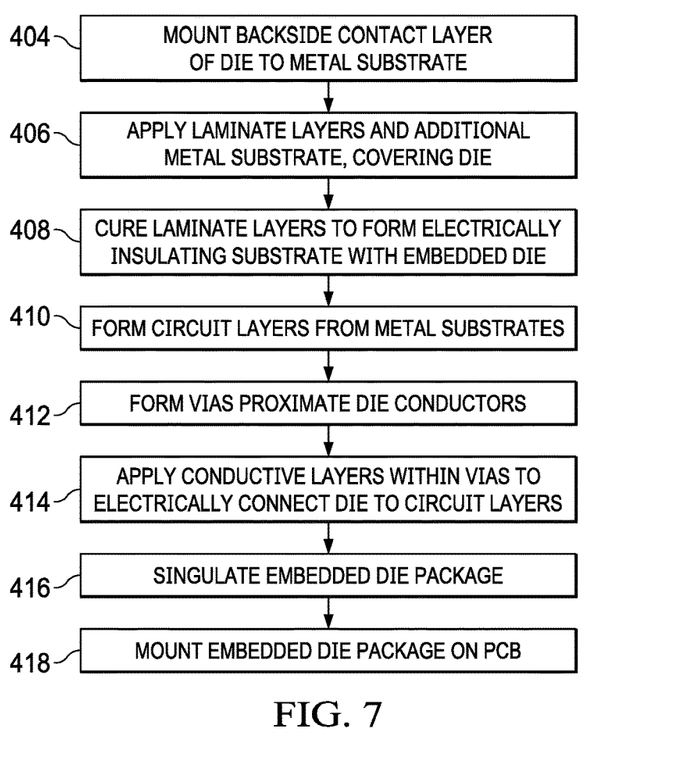
FIG. 7 is a flowchart illustrating a method of forming an embedded die package, such as the embedded die package of FIG. 6F.

As shown in FIG. 6A, die 30 with conversion coatings 128, 129 is mounted to metal substrate 154 by securing backside electrical contact layer 27 to metal substrate 154 with a die attach 157 (404). For example, die attach 157 may be a conductive die attach, such as a silver paste. Metal substrate 154 may be a copper metal substrate. Die attach 157 may cover a majority of backside electrical contact layer 27, but leaving surface 127 exposed.

Figure 6B:
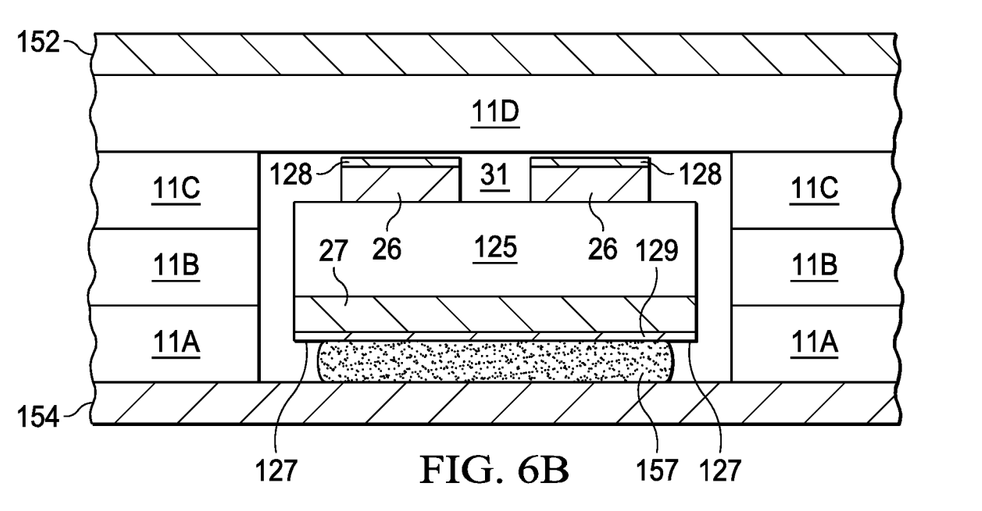

Next, as shown in FIG. 6B, laminate layers 11A, 11B, 11C and 11D are applied to metal substrate 154, covering die 30 (406). The laminate layers 11A, 11B, 11C and 11D may represent materials commonly used to form circuit boards. For example, laminate layers 11A, 11B, 11C and 11D may comprise an epoxy substrate, such as a composite including glass fiber and a polymeric epoxy. As also shown in FIG. 6B, conductive substrate 152 is applied over laminate layer 11D (406). Metal substrate 152 may be a copper metal substrate.

Figure 6C:
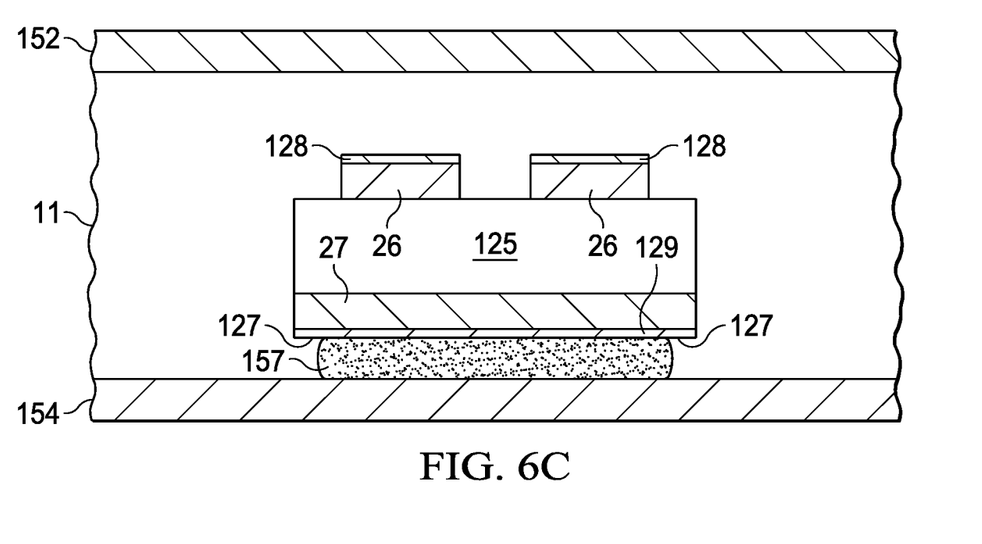

As shown in FIG. 6C, laminate layers 11A, 11B, 11C and 11D are cured to form an electrically insulating substrate 11 with die 30 embedded therein between metal substrates 152, 154 (408). Following the curing of laminate layers 11A, 11B, 11C and 11D, at least a portion of conversion coatings 128, 129 are adjacent to electrically insulating substrate 11. Conversion coatings 128, 129 may promote adhesion between electrical contacts 26 and backside electrical contact layer 27 of an embedded die 30 and the electrically insulating substrate 11. Such designs may reduce the prevalence of adhesion failure and resulting delamination compared to alternate designs not including a conversion coating.

Of particular significance may be improved adhesion along the exposed surface 127 (FIG. 6C) of backside electrical contact layer 27 adjacent to electrically insulating substrate 11. Exposed surface 127 generally surrounds a perimeter of backside electrical contact layer 27 in areas not covered by die attach 157. Adhesion failure may be caused by copper oxidation of backside electrical contact layer 27, and may be particularly problematic in examples utilizing epoxy-based polymers for substrate 11. Such adhesion failure may specifically occur between the copper and copper oxides of backside electrical contact layer 27.

Figure 6D:
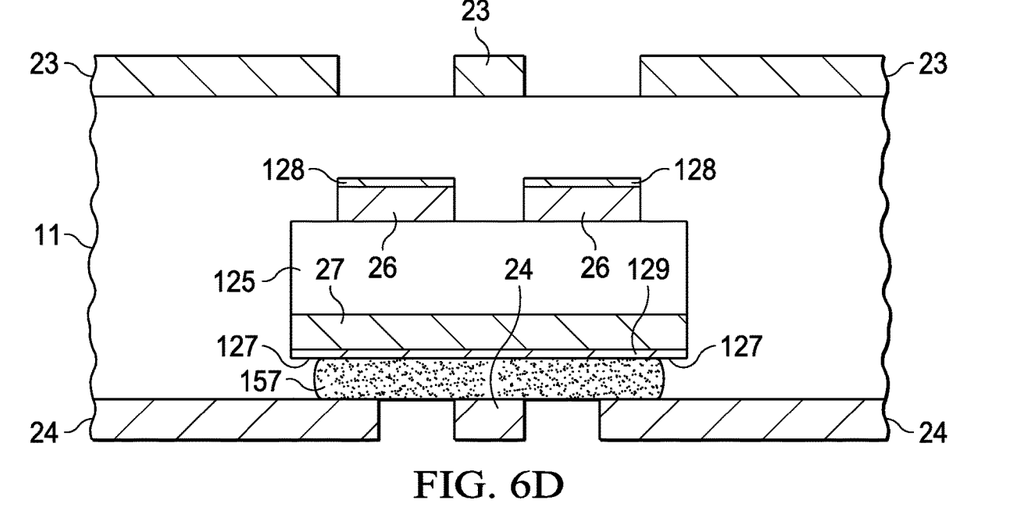

Poor adhesion between backside electrical contact layer 27 and substrate 11 may cause delamination of die 30 within substrate 11, interfering the reliability of electrical connections between die 30, vias 38, 39 and circuit layers of package 10. As shown in FIG. 6D, circuit layer 23 is formed from metal substrate 152, and circuit layer 24 is formed from metal substrate 154 (410). In examples in which metal substrates 152, 154 are copper metal substrates, circuit layers 23, 24 represent copper substrate layers within package 10.

Forming the circuit layers in the metal substrates may include any available processes for forming circuit layers in PCBs. Such processes include, but are not limited to, lithography and wet etching. Forming circuit layers 23, 24 includes opening metal substrates 152, 154 proximate the locations for vias 38, 39 (412).

Figure 6E:
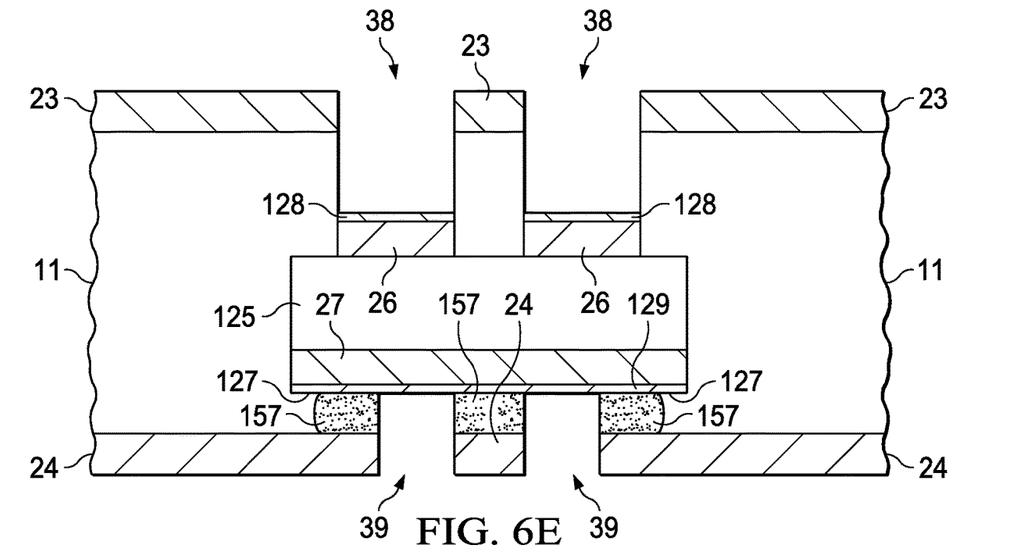

As shown in FIG. 6E, forming vias 38 further includes removing portions of electrically insulating substrate 11 proximate electrical contacts 26 on first side of semiconductor layer 125 (412). Removing the portions of electrically insulating substrate 11 may include laser ablation, mechanical drilling, or other suitable material removal techniques.

Similarly, forming vias 39 may further include removing portions of die attach 157 proximate backside electrical contact layer 27 on second side of semiconductor layer 125 (412). Alternatively, in examples in which die attach 157 is a conductive die attach, vias 39 may not be included, as a conductive die attach provides an electrical connection between backside electrical contact layer 27 and circuit layer 24. Removing the portion of die attach 157 may include laser ablation, mechanical drilling, or other suitable material removal techniques. Forming through-holes 40 (FIG. 2B) may likewise include laser ablation, mechanical drilling, or other suitable material removal techniques.

Figure 6F:
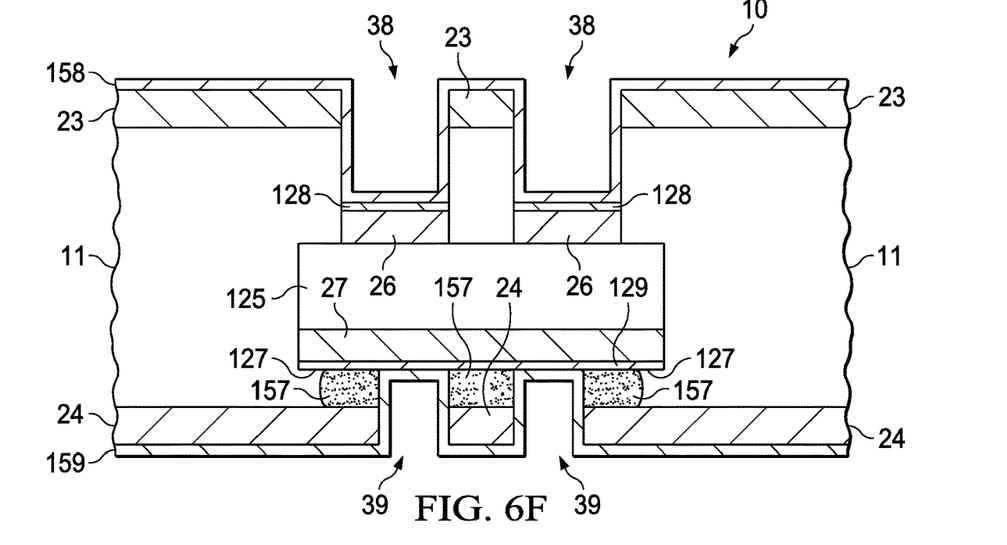

As shown in FIG. 6F, conductive layers are applied within vias 38, 39 to electrically connect die 30 to circuit layers, such as external circuit layers 23, 24, and optionally intermediate circuit layers, such as intermediate circuit layer 54 (414). In the specific example of FIG. 6F, conductive layer 158 is applied within vias 38, plating substrate 11 and electrically connecting circuit layer 23 to electrical contacts 26 on first side of semiconductor layer 125. Likewise, conductive layer 159 is applied within vias 39, electrically connecting circuit layer 24 to backside electrical contact layer 27 on second side of semiconductor layer 125. Conductive layers may likewise be applied within through-holes 40 plating substrate 11 and electrically connecting die 30 to circuit layers, such as external circuit layers 23, 24, and optionally intermediate circuit layers, such as intermediate circuit layer 54.

In some examples, conductive layer 158 may include a first sputtered copper layer coating exposed portions of electrical contacts 26 within vias 38 and at least a portion of circuit layer 23 to electrically connect electrical contacts 26 to circuit layer 23. In some of such examples, conductive layer 158 may further include an electroplating layer over the sputtered copper layer.

Similarly, conductive layer 159 may also include a sputtered copper layer coating exposed portions of backside electrical contact layer 27 within vias 39 and at least a portion of circuit layer 24 to electrically connect backside electrical contact layer 27 to circuit layer 24. In some of such examples, conductive layer 159 may further include an electroplating layer over the sputtered copper layer.

In some examples, die 30 is one of a plurality of dies embedded within a common electrically insulating substrate that includes substrate 11. In such examples, a plurality of dies are mounted to a common metal substrate 154 to form a plurality of embedded die packages in unison (step 404). The common electrically insulating substrate is formed over each of plurality of dies mounted to the common metal substrate (steps 406, 408). The circuit layers for the plurality of embedded die packages extend across the common electrically insulating substrate and are also formed in unison (step 410). In these examples, forming package 10 includes singulating a plurality of embedded die packages, including embedded die package 10, from the common electrically insulating substrate to form a plurality of embedded die packages (416). Singulation may include severing the embedded die packages from a common substrate with a cutting tool, such as a saw or laser. These singulation cuts separate the common substrate into separate embedded die packages, each singulated embedded die package including a singulated substrate, at least one embedded die, and vias providing electrical connections between the die and circuit layers of the singulated embedded die package.

The method may further include mounting embedded die package 10 on PCB 60 to form assembly 70 (418). For example, mounting embedded die package 10 on PCB 60 may include reflowing solder balls 34 to form solder joints between ball grid array 32 of embedded die package 10 and electrical contact surfaces 66 on top face 62 of PCB 60 (see FIG. 3B).

The specific techniques for embedded die packages including a conversion coating between a conductive element of and embedded die, such as an electrical contact or the backside electrical contact layer of the die, and an electrically insulating substrate, such as a laminate substrate, are merely illustrative of the general inventive concepts included in this disclosure. Additional examples for embedded die packages are provided below.

Example 1. An embedded die package comprising: an electrically insulating substrate forming a first surface and a second surface, the first surface generally opposing the second surface, a first circuit layer supported by the electrically insulating substrate, a second circuit layer supported by the electrically insulating substrate, and a die embedded in the electrically insulating substrate between the first circuit layer and the second circuit layer. The die includes a semiconductor layer, an electrical contact on a first side of the semiconductor layer, and a backside electrical contact layer on second side of the semiconductor layer. The embedded die package further includes a first via formed in the first circuit layer proximate the electrical contact on the first side of the semiconductor layer, a first conductive layer within the first via electrically connecting the first circuit layer to the electrical contact on the first side of the semiconductor layer, a second via formed in the second circuit layer proximate the backside electrical contact layer on the second side of the semiconductor layer, a second conductive layer within the second via electrically connecting the second circuit layer to the backside electrical contact layer on the second side of the semiconductor layer, a zinc layer over at least one of the electrical contact or the backside electrical contact layer of the die, and a conversion coating over the zinc layer. The conversion coating includes at least one of zirconium and vanadium. At least a portion of the conversion coating is adjacent to the electrically insulating substrate.

Example 2. The embedded die package of example 1, wherein the first via is further formed in the electrically insulating substrate, wherein the first conductive layer plates the electrically insulating substrate at the second via.

Example 3. The embedded die package of example 1 or example 2, wherein the second via is further formed in the electrically insulating substrate, wherein the second conductive layer plates the electrically insulating substrate at the second via.

Example 4. The embedded die package of any one of examples 1-3, wherein the first conductive layer within the first via includes a first sputtered copper layer coating exposed portions of the electrical contact within the first via and at least a portion of the first circuit layer to electrically connect the electrical contact to the first circuit layer.

Example 5. The embedded die package of example 4, further comprising a first electroplating layer over the first sputtered copper layer.

Example 6. The embedded die package of any one of examples 1-5, wherein the second conductive layer within the second via includes a second sputtered copper layer coating exposed portions of the backside electrical contact layer within the second via and at least a portion of the second circuit layer to electrically connect the backside electrical contact layer to the second circuit layer.

Example 7. The embedded die package of example 6, further comprising a second electroplating layer over the second sputtered copper layer.

Example 8. The embedded die package of any one of examples 1-7, further comprising a silver paste between the second circuit layer and the backside electrical contact layer on the second side of the semiconductor layer.

Example 9. The embedded die package of any one of examples 1-8, wherein the first circuit layer is a first copper substrate layer, and the second circuit layer is a second copper substrate layer.

Example 10. The embedded die package of any one of examples 1-9, wherein the first circuit layer is supported by the electrically insulating substrate along the first surface, and the second circuit layer supported by the electrically insulating substrate along the second surface of the electrically insulating substrate Example 11. The embedded die package of any of examples 1-10, wherein the electrically insulating substrate is a polymeric substrate.

Example 12. The embedded die package of any of examples 1-11, wherein the electrically insulating substrate is an epoxy substrate.

Example 13. The embedded die package of any one of examples 1-27, wherein the electrically insulating substrate consists essentially of a composite including glass fiber and a polymeric epoxy.

Example 14. The embedded die package of example 13, wherein the composite is a laminate composite.

Example 15. The embedded die package of any one of examples 1-14, wherein the conversion coating covers a surface of the backside electrical contact layer adjacent to the electrically insulating substrate.

Example 16 The embedded die package of any one of examples 1-15, wherein the conversion coating comprises a zirconium oxide.

Example 17. The embedded die package of any one of examples 1-16, wherein the conversion coating comprises a vanadium oxide.

Example 18. The embedded die package of any one of examples 1-17, wherein the conversion coating consists essentially of one or more of a group consisting of: zirconium oxide; and vanadium oxide.

Example 19. An assembly comprising: the embedded die package of any one of examples 1-18; a circuit board having at least one electrical contact surface on a first face of the circuit board, wherein said embedded die package is supported on the first face of said circuit board; and at least one solder joint electrically connecting the at least one electrical contact surface on the first face of the circuit board and the first conductive layer within the first via.

Example 20. The assembly of example 19, wherein: the electrical contact of the die is one of a plurality of electrical contacts of the die; the at least one electrical contact surface on the first face of the circuit board is a plurality of electrical contact surface on the first face of the circuit board; and the at least one solder joint is a plurality of solder joints electrically connecting the plurality of electrical contacts of the die to the plurality of electrical contact surface on the first face of the circuit board.

Example 21. A method of forming an embedded die package comprising: applying a conversion coating including at least one of zirconium and vanadium over at least one of an electrical contact or a backside electrical contact layer of a die. The die includes a semiconductor layer, the electrical contact on a first side of the semiconductor layer, the backside electrical contact layer on second side of the semiconductor layer, and a zinc layer over at least one of the electrical contact or the backside electrical contact layer of the die. The method further includes mounting the backside electrical contact layer to a second metal substrate with a die attach, applying laminate layers to the second metal substrate, covering the die, applying a first metal substrate over the laminate layers, curing the laminate layers to form an electrically insulating substrate with the die embedded in the electrically insulating substrate between the first metal substrate and the second metal substrate, wherein at least a portion of the conversion coating is adjacent to the electrically insulating substrate, forming a first circuit layer from the first metal substrate, the first circuit layer including a first via proximate the electrical contact on the first side of the semiconductor layer, the second circuit layer including a second via proximate the backside electrical contact layer on the second side of the semiconductor layer, applying a first conductive layer within the first via electrically connecting the first circuit layer to the electrical contact on the first side of the semiconductor layer, and applying a second conductive layer within the second via electrically connecting the second circuit layer to the backside electrical contact layer on the second side of the semiconductor layer.

Example 22. The method of example 21, wherein forming the first circuit layer from the first metal substrate includes lithography and wet etching.

Example 23. The method of example 21 or example 22, wherein forming second first circuit layer from the second metal substrate includes lithography and wet etching.

Example 24. The method of any one of examples 21-23, further comprising removing a portion of the electrically insulating substrate proximate the electrical contact on the first side of the semiconductor layer to form the first in the electrically insulating substrate.

Example 25. The method of example 24, wherein removing the portion of the electrically insulating substrate comprises ablating the electrically insulating substrate with a laser.

Example 26. The method of any one of examples 21-25, further comprising removing a portion of the die attach proximate the backside electrical contact layer on the second side of the semiconductor layer to form the second via in the die attach.

Example 27. The method of any one of examples 21-26, wherein the die is one of a plurality of dies embedded within the electrically insulating substrate, the method further comprising singulating a plurality of embedded die packages from the electrically insulating substrate.

Example 28. The method of any one of examples 21-27, further comprising mounting the embedded die package on a printed circuit board to form an assembly of example 19 or example 20.

Example 29. The method of any one of examples 21-28, wherein the embedded die package is the embedded die package of any one of examples 1-18.

The specific techniques and examples for embedded die packages including a conversion coating between a conductive element of and embedded die, such as an electrical contact or the backside electrical contact layer of the die, and an electrically insulating substrate, such as a laminate substrate, are merely illustrative of the general inventive concepts included in this disclosure as defined by the following examples.

What is claimed is:

1. An embedded die package comprising:
    an electrically insulating substrate forming a first surface and a second surface, the first surface generally opposing the second surface;
    a first circuit layer supported by the electrically insulating substrate;
    a second circuit layer supported by the electrically insulating substrate;
    a die embedded in the electrically insulating substrate between the first circuit layer and the second circuit layer, the die including:
        a semiconductor layer;
        an electrical contact on a first side of the semiconductor layer; and
        a backside electrical contact layer on second side of the semiconductor layer;
    a zinc layer over at least one of the electrical contact or the backside electrical contact layer of the die; and
    a conversion coating over the zinc layer, wherein the conversion coating includes at least one of zirconium and vanadium,
    wherein at least a portion of the conversion coating is adjacent to the electrically insulating substrate.

2. The embedded die package of claim 1, further comprising:
    a first via formed in the first circuit layer proximate the electrical contact on the first side of the semiconductor layer; and
    a first conductive layer within the first via electrically connecting the first circuit layer to the electrical contact on the first side of the semiconductor layer.

3. The embedded die package of claim 2, wherein the first via is further formed in the electrically insulating substrate, wherein the first conductive layer plates the electrically insulating substrate at the first via.

4. The embedded die package of claim 2, further comprising:
    a second via formed in the second circuit layer proximate the backside electrical contact layer on the second side of the semiconductor layer; and a second conductive layer within the second via electrically connecting the second circuit layer to the backside electrical contact layer on the second side of the semiconductor layer.

5. The embedded die package of claim 1, further comprising a die attach paste between the second circuit layer and the backside electrical contact layer on the second side of the semiconductor layer.

6. The embedded die package of claim 1, wherein the first circuit layer is a first copper substrate layer, and the second circuit layer is a second copper substrate layer.

7. The embedded die package of claim 1, wherein the first circuit layer is supported by the electrically insulating substrate along the first surface, and the second circuit layer supported by the electrically insulating substrate along the second surface of the electrically insulating substrate.

8. The embedded die package of claim 1, wherein the electrically insulating substrate is an epoxy substrate.

9. The embedded die package of claim 1, wherein the conversion coating covers a surface of the backside electrical contact layer adjacent to the electrically insulating substrate.

10. The embedded die package of claim 1, wherein the conversion coating comprises one or more of a group consisting of:
zirconium oxide; and
vanadium oxide.

11. A semiconductor die comprising:
a semiconductor layer;
an electrical contact on a first side of the semiconductor layer;
a backside electrical contact layer on second side of the semiconductor layer;
a zinc layer over at least one of the electrical contact or the backside electrical contact layer of the die; and
a conversion coating over the zinc layer, wherein the conversion coating includes at least one of zirconium and vanadium.

12. The semiconductor die of claim 11, wherein the conversion coating covers a surface of the backside electrical contact layer.

13. The semiconductor die of claim 11, wherein the conversion coating covers a surface of the electrical contact on the first side of the semiconductor layer.

14. The semiconductor die of claim 11, wherein the conversion coating comprises one or more of a group consisting of:
zirconium oxide; and
vanadium oxide.

15. The semiconductor die of claim 11,
wherein the backside electrical contact layer comprises copper or copper alloys, and
wherein the zinc layer is over the backside electrical contact layer.

16. The semiconductor die of claim 11, wherein the conversion coating consists essentially of one or more of a group consisting of:
zirconium oxide; and
vanadium oxide.

17. The embedded die package of claim 5, wherein the portion of the conversion coating adjacent to the electrically insulating substrate generally surrounds a perimeter of the backside electrical contact layer in areas not covered by the die attach paste.

18. The embedded die package of claim 1,
wherein the backside electrical contact layer comprises copper or copper alloys, and
wherein the zinc layer is over the backside electrical contact layer.

19. The embedded die package of claim 1, wherein the conversion coating consists essentially of one or more of a group consisting of:
zirconium oxide; and
vanadium oxide.

20. An embedded die package comprising:
an electrically insulating substrate forming a first surface and a second surface, the first surface generally opposing the second surface;
a first circuit layer supported by the electrically insulating substrate;
a second circuit layer supported by the electrically insulating substrate;
a die embedded in the electrically insulating substrate between the first circuit layer and the second circuit layer, the die including:
a semiconductor layer;
an electrical contact on a first side of the semiconductor layer; and
a backside electrical contact layer on second side of the semiconductor layer, wherein the backside electrical contact layer comprises copper or copper alloys;
a zinc layer over the backside electrical contact layer of the die;
a conversion coating over the zinc layer, wherein the conversion coating includes at least one of zirconium and vanadium; and
a die attach paste between the second circuit layer and the backside electrical contact layer on the second side of the semiconductor layer,
wherein the conversion coating is adjacent to the electrically insulating substrate in areas on the backside electrical contact layer not covered by the die attach paste.

* * * * *